(12) United States Patent
Ahn et al.

(10) Patent No.: US 11,852,655 B2
(45) Date of Patent: Dec. 26, 2023

(54) MULTILAYER WIRING SUBSTRATE, METHOD OF MANUFACTURING SAME, AND PROBE CARD HAVING SAME

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 514 days.

(21) Appl. No.: 17/038,642

(22) Filed: Sep. 30, 2020

(65) Prior Publication Data

US 2021/0116478 A1 Apr. 22, 2021

(30) Foreign Application Priority Data

Oct. 17, 2019 (KR) .................. 10-2019-0129263

(51) Int. Cl.
*G01R 1/073* (2006.01)
*H05K 1/02* (2006.01)
*H05K 3/10* (2006.01)
*H05K 3/46* (2006.01)

(52) U.S. Cl.
CPC ....... *G01R 1/07342* (2013.01); *H05K 1/0298* (2013.01); *H05K 3/107* (2013.01); *H05K 3/462* (2013.01)

(58) Field of Classification Search
CPC .. G01R 1/07342; H05K 1/0298; H05K 3/107; H05K 3/462; H05K 3/4061; H05K 3/4617; H05K 3/4623; H05K 2201/09227; H05K 2201/10378; H05K 2203/0315; H01L 23/5226; H01L 23/13; H01L 23/481; H01L 23/49827; H01L 23/49866; H01L 23/525
See application file for complete search history.

(56) References Cited

U.S. PATENT DOCUMENTS 11,497,126 B2 * 11/2022 Ahn ................. H05K 3/4015
2009/0039906 A1 * 2/2009 Yamada ............ G01R 1/07378
324/762.05
2017/0330828 A1 * 11/2017 Kurooka ......... H01L 23/49894

FOREIGN PATENT DOCUMENTS

| JP | 5084668 B2 | 12/1993 |
| KR | 10-2017-0139321 | * 12/2017 |
| KR | 1020170139321 A | 12/2017 |

OTHER PUBLICATIONS

English Machine Translation of Ahn et al. KR 10-2017-0139321 (Year: 2017).*

* cited by examiner

*Primary Examiner* — Lee E Rodak

(57) ABSTRACT

Proposed is a multilayer wiring substrate having excellent joining strength, a method of manufacturing the multilayer wiring substrate, and a probe card having the multilayer wiring substrate.

8 Claims, 10 Drawing Sheets

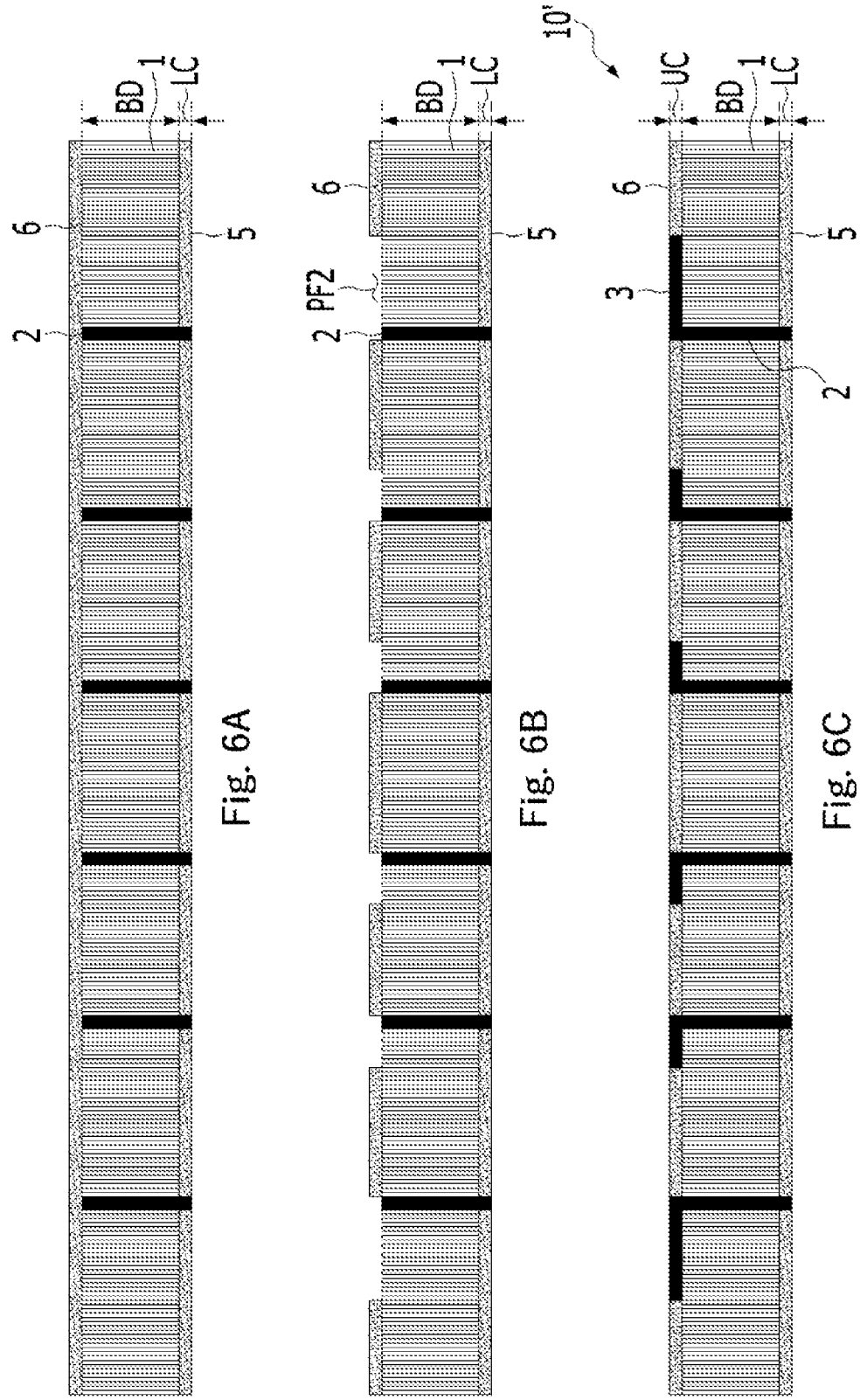

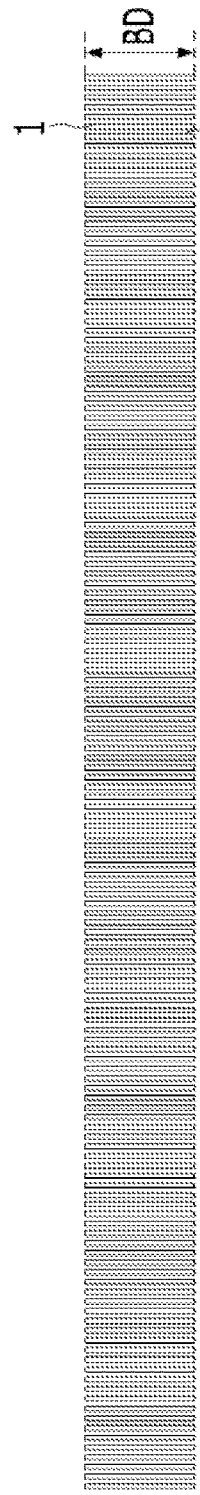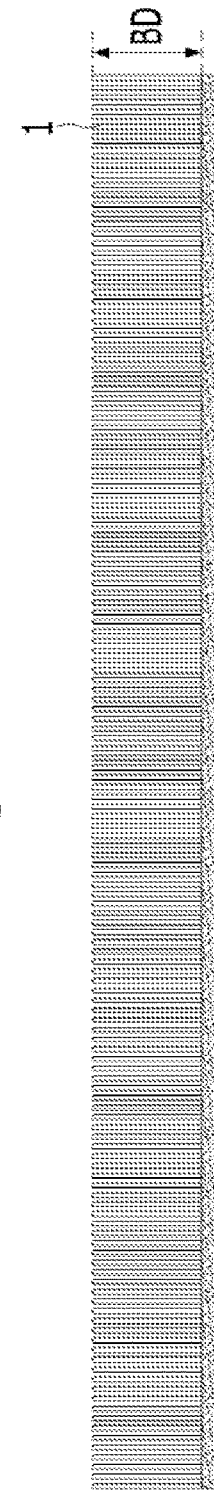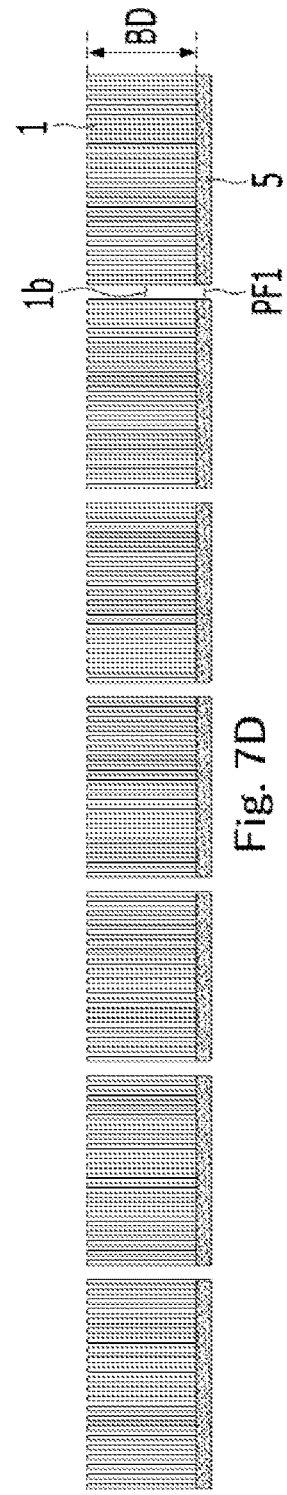

MULTILAYER WIRING SUBSTRATE, METHOD OF MANUFACTURING SAME, AND PROBE CARD HAVING SAME

CROSS REFERENCE TO RELATED APPLICATION

The present application claims priority to Korean Patent Application No. 10-2019-0129263, filed Oct. 17, 2019, the entire contents of which is incorporated herein for all purposes by this reference.

BACKGROUND OF THE INVENTION

Field of the Invention

The present invention relates to a multilayer wiring substrate having excellent joining strength, a method of manufacturing the multilayer wiring substrate, and a probe card having the multilayer wiring substrate.

Description of the Related Art

With the recent trend toward miniaturization of semiconductor devices, the size and pitch of electrodes of the semiconductor device have become finer, and this has led to a demand for reducing the thickness of probes of a probe card. In order to compensate for a difference in pitch between such fine-pitch probes and the PCB substrate, the probe card may include a wiring substrate between the probes and a printed circuit board (PCB) substrate. The wiring substrate includes through-holes for providing a via conductor for electrically connecting the probes and the PCB substrate to each other. As the pitch of the probes becomes finer, there is also a demand for making the pitch of the through-holes of the wiring substrate fine.

Conventional wiring substrates are mainly made of sintered alumina or sintered mullite having high mechanical strength. A machining method using a laser or a drill is used to form through-holes in the wiring substrate made of such a material.

However, the machining method has limitations in realizing a reduction in size and pitch of the through-holes because the through-holes have to be formed in consideration of mechanical errors.

The conventional wiring substrate made of the sintered alumina or sintered mullite is formed through a high-temperature firing process at 1200° C. or higher. Therefore, a material having a high melting point (e.g., molybdenum (Mo), tungsten (W)) is required as a via conductor provided in the wiring substrate. This is because a via conductor made of a material having a low melting point melts at a temperature lower than the temperature of the high-temperature firing process and is thus not fired.

However, a via conductor made of a material having a high melting point is increased in wiring resistance due to due to its high resistance characteristics, resulting in delay of an electrical signal when performing the function of the probe card, which is problematic Conventionally, in order to solve the disadvantages of the wiring substrate made of the above sintered alumina or sintered mullite, there has been developed a technology for stacking a plurality of wiring substrates made of an anodic oxide film material and joining the wiring substrates using an anisotropic conductive film (ACF). The anisotropic conductive film is a film in which cores made of a conductive material are configured as a plurality of particles covered with an insulating film. The anisotropic conductive film can electrically connect a vertical wiring part and a horizontal wiring part of different layers by the cores as the insulating film is destroyed only at a portion to which pressure or heat is applied.

FIGS. 1A and 1B are views schematically illustrating a wiring substrate P according to the related art, the substrate being made of an anodic oxide film material and to which an anisotropic conductive film 1000 is joined.

As illustrated in FIG. 1A, the wiring substrate P made of the anodic oxide film material may include a vertical wiring part 2 and a horizontal wiring part 3 connected to the vertical wiring part 2. The anisotropic conductive film 1000 may be provided on the wiring substrate P. The anisotropic conductive film 1000 may be provided on the wiring substrate P by being joined to an upper surface of the horizontal wiring part 3. In other words, the anisotropic conductive film 1000 may be provided in a structure that is joined to an upper portion of the wiring substrate P while being supported by the upper surface of the horizontal wiring part 3.

The anisotropic conductive film 1000 provided between a plurality of wiring substrates P may join the plurality of wiring substrates P to each other while being thermally compressed. However, in the case of joining the wiring substrates P in a state in which the anisotropic conductive film 1000 is provided on the horizontal wiring part 3, a gap G exists between the anisotropic conductive film 1000 and the horizontal wiring part 3 upon the thermal compression of the anisotropic conductive film 1000. This gap G may cause weakening of joining strength between the plurality of wiring substrates P.

Specifically, as illustrated in FIG. 1A, since the anisotropic conductive film 1000 is provided on the horizontal wiring part 3, there exists a height difference between the horizontal wiring part 3 and the anisotropic conductive film 1000. In this case, the anisotropic conductive film 1000 that is being thermally compressed may be pressed into a height difference space by a pressing force, the height difference space corresponding to the height difference.

As illustrated in FIG. 1B, when the anisotropic conductive film 1000 is pressed into the height difference space by the pressing force, a predetermined gap G exists between the anisotropic conductive film 1000 and the horizontal wiring part 3. Due to the gap G existing between the anisotropic conductive film 1000 and the horizontal wiring part 3, the joining strength between the plurality of wiring substrates P joined by the anisotropic conductive film 1000 may be weakened. In other words, in the structure including the anisotropic conductive film 1000 on the horizontal wiring part 3, the gap G where the wiring substrates P remain unjoined may exist, resulting in a problem that the joining strength is reduced.

The foregoing is intended merely to aid in the understanding of the background of the present invention, and is not intended to mean that the present invention falls within the purview of the related art that is already known to those skilled in the art.

Documents of Related Art (Patent document 1) Japanese Patent No. 5084668
(Patent document 2) Korean Patent Application Publication No. 10-2017-0139321

SUMMARY OF THE INVENTION

Accordingly, the present invention has been made keeping in mind the above problems occurring in the related art, and an objective of the present invention is to provide a multilayer wiring substrate capable of realizing fine-pitch through-holes and having excellent joining strength without the need to perform a high-temperature firing process, to provide a method of manufacturing the multilayer wiring substrate, and to provide a probe card having the multilayer wiring substrate.

In order to achieve the above objective, according to one aspect of the present invention, there is provided a method of manufacturing a multilayer wiring substrate, the method including: manufacturing a unit anodic oxide film wiring substrate in such a manner that a through-hole is formed by etching at least a part of an anodic oxide film, a vertical wiring part is formed by charging a metal material into the through-hole, a junction layer is formed on at least a side of the anodic oxide film, the junction layer is subjected to patterning, and a horizontal wiring part is formed on an upper surface of the patterned anodic oxide film so as to be connected to the vertical wiring part; providing a plurality of unit anodic oxide film wiring substrates and stacking the unit anodic oxide film wiring substrates from top to bottom; and joining the unit anodic oxide film wiring substrates stacked from top to bottom to each other by the junction layer.

Furthermore, the junction layer may be a photosensitive material.

Furthermore, the metal material may be a low-resistance metal material including at least one of Au, Ag, and Cu.

Furthermore, the vertical wiring part and the horizontal wiring part may be made of the same metal material.

Furthermore, the vertical wiring part and the horizontal wiring part may be simultaneously formed or are individually formed and connected to each other.

According to another aspect of the present invention, there is provided a method of manufacturing a multilayer wiring substrate, the method including: manufacturing a unit anodic oxide film wiring substrate in such a manner that a first junction layer is provided on a lower portion of an anodic oxide film, the first junction layer is subjected to patterning, a through-hole is formed by etching at least a part of the anodic oxide film, a vertical wiring part is formed by charging a metal material into the through-hole, a second junction layer is formed on an upper portion of the anodic oxide film, the second junction layer is subjected to patterning, and a horizontal wiring part is formed on an upper surface of the patterned anodic oxide film so as to be connected to the vertical wiring part; providing a plurality of unit anodic oxide film wiring substrates and stacking the unit anodic oxide film wiring substrates from top to bottom; and joining the unit anodic oxide film wiring substrates stacked from top to bottom to each other by the first and second junction layers.

Furthermore, the vertical wiring part and the horizontal wiring part may be simultaneously formed or are individually formed and connected to each other.

According to still another aspect of the present invention, there is provided a multilayer wiring substrate configured by joining unit anodic oxide film wiring substrates to each other from top to bottom by a junction layer, each of the unit anodic oxide film wiring substrates including a vertical wiring part passing through an anodic oxide film from top to bottom and a horizontal wiring part provided on an upper surface of the anodic oxide film so as to be connected to the vertical wiring part, wherein each of the unit anodic oxide film wiring substrates may include: a body part including the anodic oxide film having a through-hole and the vertical wiring part provided in the through-hole; and an upper layer part provided on an upper portion of the body part and including the horizontal wiring part provided to be connected to the vertical wiring part and the junction layer provided around the horizontal wiring part.

According to still another aspect of the present invention, there is provided a multilayer wiring substrate configured by joining unit anodic oxide film wiring substrates to each other from top to bottom by first and second junction layers, each of the unit anodic oxide film wiring substrates including a vertical wiring part passing through an anodic oxide film from top to bottom and a horizontal wiring part provided on an upper surface of the anodic oxide film so as to be connected to the vertical wiring part, wherein each of the unit anodic oxide film wiring substrates may include: a body part including the anodic oxide film having a through-hole and the vertical wiring part provided in the through-hole; a lower layer part provided on a lower portion of the body part and including the vertical wiring part and the first junction layer provided around the vertical wiring part; and an upper layer part provided on an upper portion of the body part and including the horizontal wiring part provided to be connected to the vertical wiring part and the second junction layer provided around the horizontal wiring part.

According to still another aspect of the present invention, there is provided a probe card having a multilayer wiring substrate configured by joining unit anodic oxide film wiring substrates to each other from top to bottom by a junction layer, each of the unit anodic oxide film wiring substrates including a vertical wiring part passing through an anodic oxide film from top to bottom and a horizontal wiring part provided on an upper surface of the anodic oxide film so as to be connected to the vertical wiring part, the probe card including: the unit anodic oxide film wiring substrates each including a body part including the anodic oxide film having a through-hole and the vertical wiring part provided in the through-hole, and an upper layer part provided on an upper portion of the body part and including the horizontal wiring part provided to be connected to the vertical wiring part and the junction layer provided around the horizontal wiring part; a first connection pad provided on a lower portion of the joined unit anodic oxide film wiring substrates; a second connection pad provided on an upper portion of the joined unit anodic oxide film wiring substrates and electrically connected to a terminal of a printed circuit board (PCB) substrate; and a probe electrically connected to the first connection pad.

The present invention can have a structure in which the plurality of unit anodic oxide film wiring substrates joined to each other without gaps by the junction layer are stacked. Therefore, it is possible to realize excellent joining strength in terms of structure. In addition, it is possible to easily realize fine-pitch through-holes for providing a wiring part. The present invention can be suitable for providing a low-resistance metal material as a wiring part in the fine-pitch through-holes. This can increase the transmission speed of an electrical signal during a test process using the probe card. As a result, it is possible to obtain an effect of increasing reliability of the probe card.

BRIEF DESCRIPTION OF THE DRAWINGS

The above and other objectives, features, and other advantages of the present invention will be more clearly understood from the following detailed description when taken in conjunction with the accompanying drawings, in which:

FIGS. 5A, 5B, 5C, 5D, and 5E and FIGS. 6A, 6B, and 6C are views illustrating a method of manufacturing a multilayer wiring substrate according to a second embodiment of the present invention;

FIGS. 7A, 7B, 7C, and 7D and FIGS. 8A, 8B, and 8C are views schematically illustrating another embodiment of the method of manufacturing the multilayer wiring substrate according to the second embodiment of the present invention;

DETAILED DESCRIPTION OF THE INVENTION

Figure 1A:
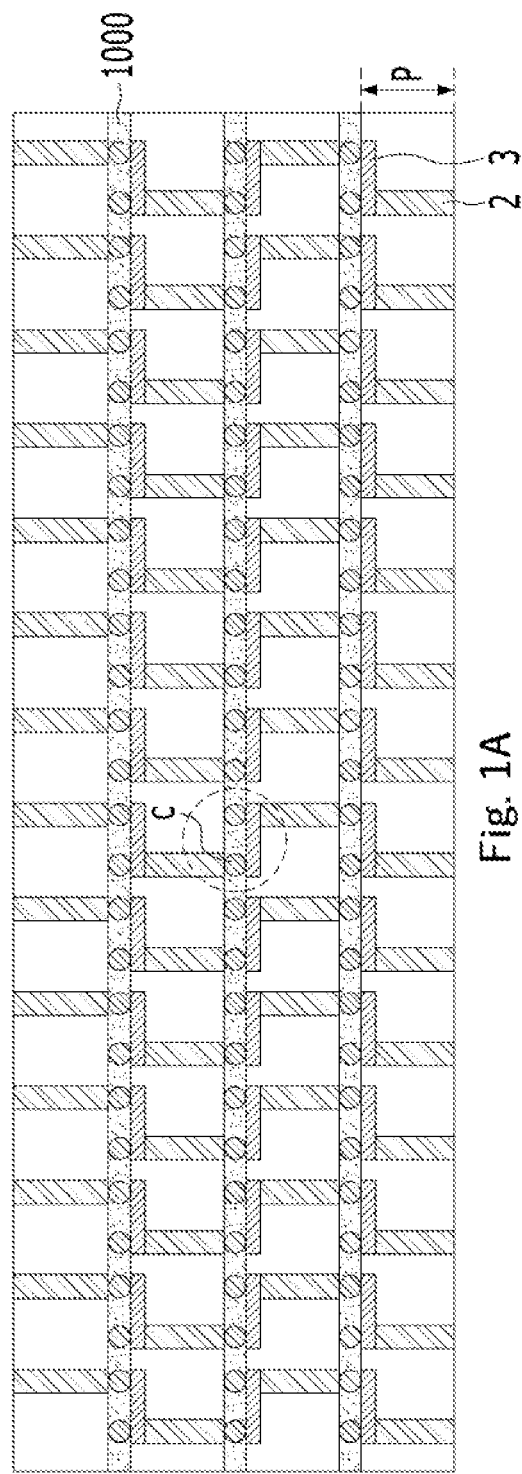
FIGS. 1A and 1B are views schematically illustrating a multilayer wiring substrate according to the related art.
Figure 1B:
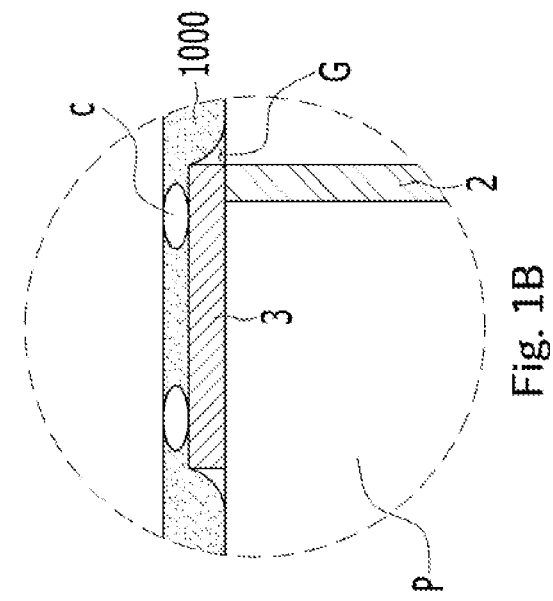

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited the exemplary embodiments and the conditions.

The above described objectives, features, and advantages will be more apparent through the following detailed description related to the accompanying drawings, and thus those of ordinary skill in the art may easily implement the technical spirit of the invention.

The embodiments of the present invention will be described with reference to cross-sectional views and/or perspective views which schematically illustrate ideal embodiments of the present invention. For explicit and convenient description of the technical content, sizes and widths of members and regions in the figures may be exaggerated. Therefore, variations from the shapes of the illustrations as a result, for example, of manufacturing techniques and/or tolerances, are to be expected.

In addition, a limited number of holes are illustrated in the drawings. Thus, the embodiments should not be construed as limited to the particular shapes of regions illustrated herein but are to include deviations in shapes that result, for example, from manufacturing.

Wherever possible, the same reference numerals will be used throughout different embodiments and the description to refer to the same or like elements or parts. In addition, the configuration and operation already described in other embodiments will be omitted for convenience.

Hereinafter, exemplary embodiments of the present invention will be described in detail with reference to the accompanying drawings.

FIGS. 2A, 2B, 2C, 2D, and 2E are views schematically illustrating a method of manufacturing a unit anodic oxide film wiring substrate 10 constituting a multilayer wiring substrate 100 according to a first embodiment of the present invention.

The multilayer wiring substrate 100 according to the first embodiment of the present invention may be manufactured by a method including: manufacturing the unit anodic oxide film wiring substrate 10 in such a manner that a through-hole 1b is formed by etching at least a part of an anodic oxide film 1, a vertical wiring part 2 is formed by charging a metal material into the through-hole 1b, a junction layer 4 is formed on at least a side of the anodic oxide film 1, the junction layer 4 is subjected to patterning, and a horizontal wiring part 3 is formed on an upper surface of the patterned anodic oxide film 1 so as to be connected to the vertical wiring part 2; providing a plurality of unit anodic oxide film wiring substrates 10 and stacking the unit anodic oxide film wiring substrates 10 from top to bottom; and joining the unit anodic oxide film wiring substrates 10 stacked from top to bottom to each other by the junction layer 4.

First, to manufacture the multilayer wiring substrate 100 according to the first embodiment of the present invention, a process of manufacturing the unit anodic oxide film wiring substrate 10 may be performed.

Figure 2A:
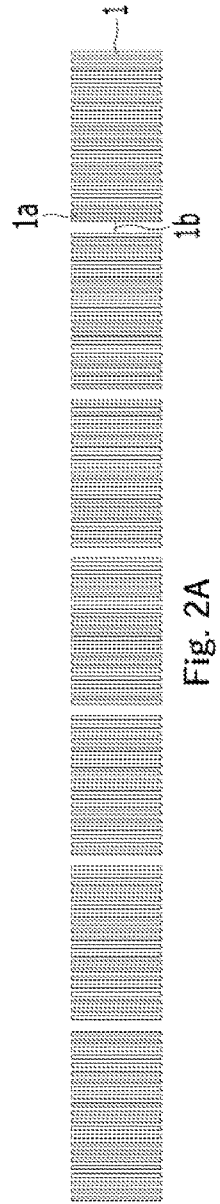
FIGS. 2A, 2B, 2C, 2D, and 2E are views schematically illustrating a method of manufacturing a multilayer wiring substrate according to a first embodiment of the present invention.

As illustrated in FIG. 2A, the anodic oxide film 1 having the through-hole 1b may be provided. The anodic oxide film 1 may have a low coefficient of thermal expansion. Therefore, by configuring the unit anodic oxide film wiring substrate 10 with the anodic oxide film 1, it may be possible to prevent thermal deformation under a high-temperature environment. As a result, it may be possible to increase yield of a product upon manufacturing the multilayer wiring substrate 100, and there is an effect of achieving high product reliability even in a process using a probe card 200, which is performed in a high temperature atmosphere.

The anodic oxide film 1 may have a shape including a plurality of regularly arranged pores 1a that are formed by anodizing a metal material before the formation of the through-hole 1b. A photosensitive material may be provided on the upper surface of the anodic oxide film 1. The photosensitive material may be at least partially patterned by a photoresist process. The anodic oxide film 1 may be etched in an area from which the photosensitive material has been removed by patterning. Through this process, the through-hole 1b may be formed in the anodic oxide film 1.

The through-hole 1b formed by etching may have an inner wall vertically formed in a straight shape. This may make it possible to easily form a plurality of fine-pitch through-holes 1b in the anodic oxide film 1. The through-hole 1b may be formed to have a larger diameter than each of the pores 1a of the anodic oxide film 1.

Figure 2B:
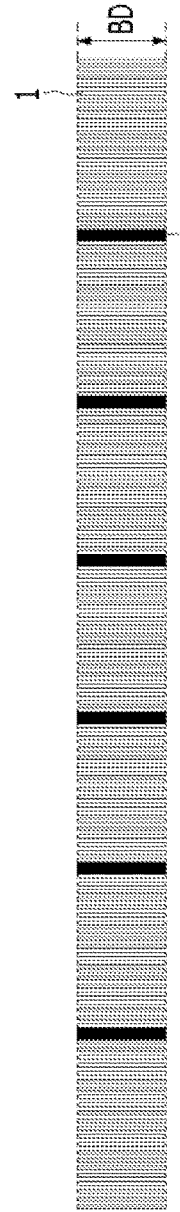

Then, as illustrated in FIG. 2B, a process of forming the vertical wiring part 2 in each of the through-holes 1b may be performed. Through this process, a body part BD of the unit anodic oxide film wiring substrate 10 according to the present invention may be formed.

The vertical wiring part 2 may be formed by charging a metal material into the through-hole 1b. The metal material charged into the through-hole 1b may be a low-resistance metal material including at least one of Au, Ag, and Cu. In the case of forming the vertical wiring part 2 by charging the low-resistance metal material having the above configuration into the through-hole 1b, wiring resistance is low, which may increase transmission speed of an electrical signal. As a result, it may be more advantageous in an electrical test of a semiconductor chip using the probe card 200.

Figure 2C:
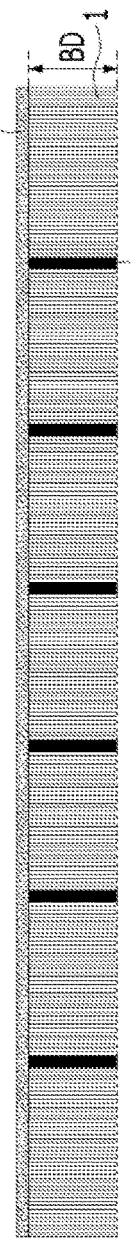

Then, as illustrated in FIG. 2C, a process of forming the junction layer 4 on an upper portion of the anodic oxide film 1 may be performed. Since the junction layer 4 may be provided to join the unit anodic oxide film wiring substrates 10 to each other, the junction layer 4 may be provided on at least a side of the anodic oxide film 1 depending on a structure in which the unit anodic oxide film wiring substrates 10 are stacked. In FIG. 2C, as an example, the junction layer 4 may be provided on the upper portion of the anodic oxide film 1. The junction layer 4 provided on the upper portion of the anodic oxide film 1 may have a structure supported by the body part BD of the unit anodic oxide film wiring substrate 10. The junction layer 4 may be a photosensitive material, and as an example, may be a dry film photoresist (DFR).

Meanwhile, the junction layer 4 may be a thermosetting resin. In this case, examples of the thermosetting resin may include polyimide resin, polyquinoline resin, polyamideimide resin, epoxy resin, polyphenylene ether resin, fluororesin, and the like.

In the present invention, by providing the junction layer on the upper portion of the anodic oxide film 1, the plurality of unit anodic oxide film wiring substrates 10 may be joined to each other in a stacked structure without the need for a high-temperature firing process.

Figure 2D:

Then, as illustrated in FIG. 2D, a process of patterning at least a part of the junction layer 4 provided on the upper portion of the anodic oxide film 1 may be performed. The junction layer 4 may be patterned to allow the horizontal wiring part 3 to be provided on the upper surface of the anodic oxide film 1 so as to be connected to each of the respective vertical wiring parts 2. Therefore, a patterned area PF of the junction layer 4 may preferably include a vertical projection area of each of the vertical wiring parts 2. Due thereto, as illustrated in FIG. 2D, an upper surface of each of the vertical wiring parts 2 may be exposed as a result of patterning the junction layer 4.

The patterned area PF may be formed to include the vertical projection area of the vertical wiring part 2, while including a vertical projection area of a pore 1a neighboring to the vertical wiring part 2. Therefore, a structure in which as an upper surface of the pore 1a neighboring to the vertical wiring part 2 is exposed, at least a part of the upper surface of the anodic oxide film 1 is exposed by the patterned area PF may be formed.

In the present invention, as illustrated in FIG. 2D, by forming the patterned area PF by the process of patterning the junction layer 4, a space for forming the horizontal wiring part 3 may be provided. After providing the space for forming the horizontal wiring part 3 by patterning, the junction layer 4 may remain on the upper surface of the anodic oxide film 1 without removal to perform a joining function by an unpatterned area.

In other words, the junction layer 4 may simultaneously perform a function for providing the space for forming the horizontal wiring part 3, and a joining function for joining the unit anodic oxide film wiring substrates 10 to each other after the horizontal wiring part 3 is formed in the patterned area PF. Therefore, preferably, the junction layer 4 is configured to have photosensitive properties because the junction layer 4 has to be patterned by a photoresist process, and to have properties as a joining material because the junction layer 4 has to perform the joining function.

Figure 2E:
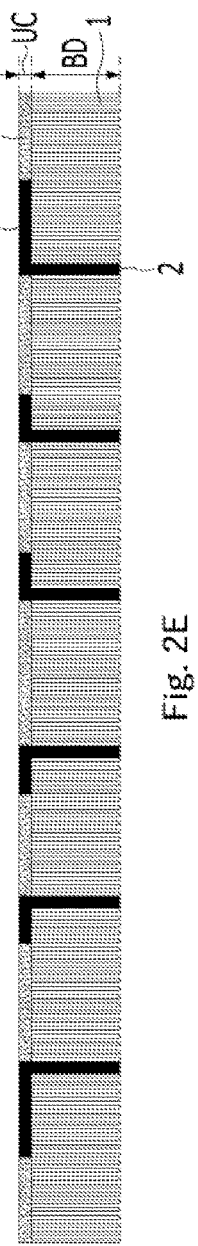

Then, as illustrated in FIG. 2E, a process of forming the horizontal wiring part 3 in each of the respective patterned areas PF may be performed. The horizontal wiring part 3 may be formed by a thin film forming method such as vapor deposition, sputtering, or ion plating.

The horizontal wiring part 3 may be formed by charging a metal material into the patterned area PF. The metal material forming the horizontal wiring part 3 may be a low-resistance metal material including at least one of Au, Ag, and Cu. The metal material of the horizontal wiring part 3 may be the same as that of the vertical wiring part 2 formed in the through-hole 1b. In other words, the vertical wiring part 2 and the horizontal wiring part 3 may be made of the same metal material.

Since the horizontal wiring part 3 may be formed in the patterned area PF, the junction layer 4 may be provided around the horizontal wiring part 3. Therefore, a structure in which the horizontal wiring part 3 is included in the junction layer 4 provided on the anodic oxide film 1 may be formed.

Meanwhile, before forming the vertical wiring part 2 and the horizontal wiring part 3, a conductor paste including metal powder, such as Cu powder, and resin as main components, or molten solder may be charged into the through-hole 1b and the patterned area PF. Such a conductor paste or molten solder may function as the vertical wiring part 2 and the horizontal wiring part 3.

In the present invention, by providing the junction layer 4 on at least the side of the anodic oxide film 1 and providing the horizontal wiring part 3 in the patterned area PF of the junction layer 4, a structure in which both the junction layer 4 and the horizontal wiring part 3 are provided on the same plane in one layer provided on the anodic oxide film 1 may be formed. Such a structure may prevent a gap from existing between the unit anodic oxide film wiring substrates 10 joined to each other by the junction layer 4. As a result, this may increase joining strength of the multilayer wiring substrate 100 composed of the plurality of unit anodic oxide film wiring substrates 10 joined to each other by the junction layer 4.

Since the horizontal wiring part 3 may be provided in the patterned area PF, a structure in which an upper layer part UC is provided on an upper portion of the body part BD of the unit anodic oxide film wiring substrate 10 may be formed. As illustrated in FIG. 2E, the upper layer part UC may be composed of the horizontal wiring part 3 and the junction layer 4 provided around the horizontal wiring part 3 and may be supported by an upper surface of the body part BD.

The horizontal wiring part 3 formed in the patterned area PF may be joined to the vertical wiring part 2 without a gap by a joining method between metals. In this case, a metal joining method of joining the horizontal wiring part 3 and the vertical wiring part 2 may be a known metal joining method, and may be a method capable of joining metals without a gap therebetween. As an example, a method of heating and melting metal materials constituting the vertical wiring part 2 and the horizontal wiring part 3 may be used.

By performing the above-described process, the unit anodic oxide film wiring substrate 10 may be manufactured. Then, a process of providing the plurality of unit anodic oxide film wiring substrates 10 by performing the same process and stacking the unit anodic oxide film wiring substrates 10 from top to bottom may be performed. Then, a process of joining the unit anodic oxide film wiring substrates 10 stacked from top to bottom to each other by the junction layer 4 may be performed. Through this process, the multilayer wiring substrate 100 according to the present invention may be manufactured.

As described above, since the multilayer wiring substrate 100 according to the present invention may be manufactured by joining the unit anodic oxide film wiring substrates 10 to each other by the junction layer 4, there may be no need to perform a high-temperature firing process. Therefore, it may be possible to provide a low-resistance metal material including at least one of Au, Ag, and Cu as the vertical wiring part 2 and the horizontal wiring part 3. As a result, transmission speed of an electric signal may be excellent.

The unit anodic oxide film wiring substrates 10 constituting the multilayer wiring substrate 100 according to the present invention may be manufactured by other methods. FIGS. 3A, 3B, 3C, and 3D are views schematically illustrating another embodiment of the method of manufacturing the unit anodic oxide film wiring substrate 10 constituting the multilayer wiring substrate 100 according to the first embodiment.

Figure 3A:
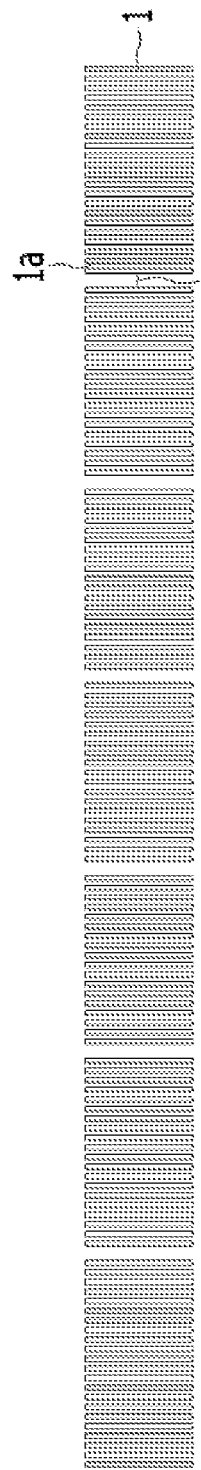
FIGS. 3A, 3B, 3C, and 3D are views schematically illustrating another embodiment of the method of manufacturing the multilayer wiring substrate according to the first embodiment of the present invention.
Figure 3B:
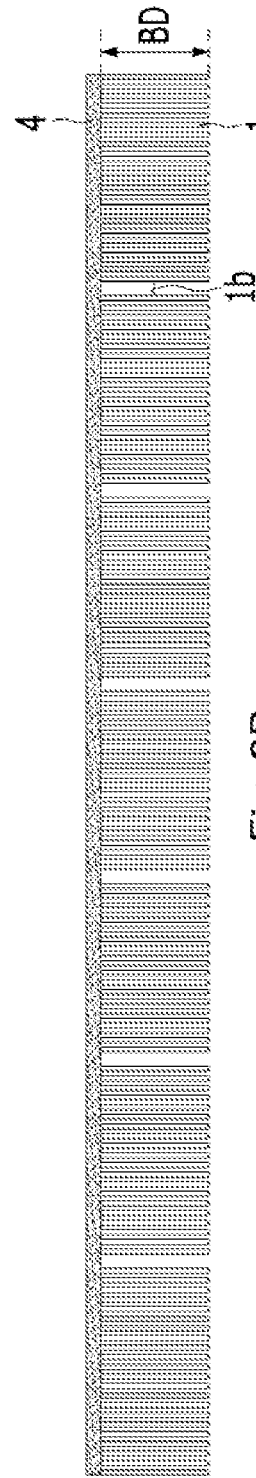
Figure 3C:
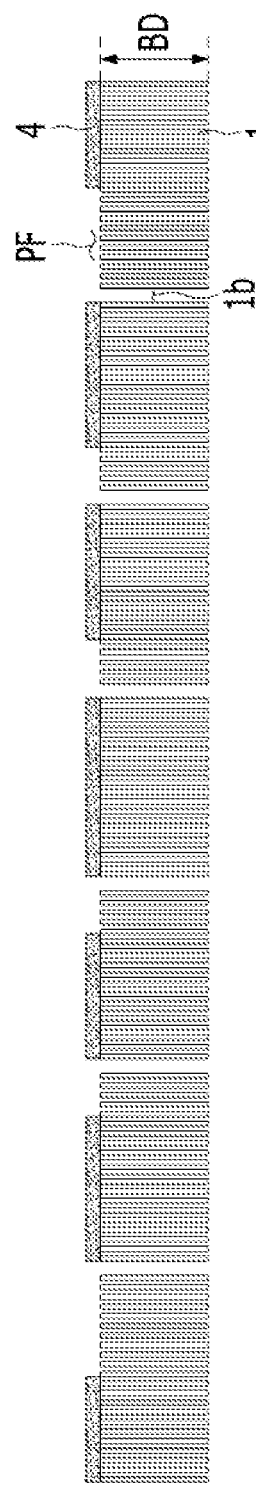
Figure 3D:
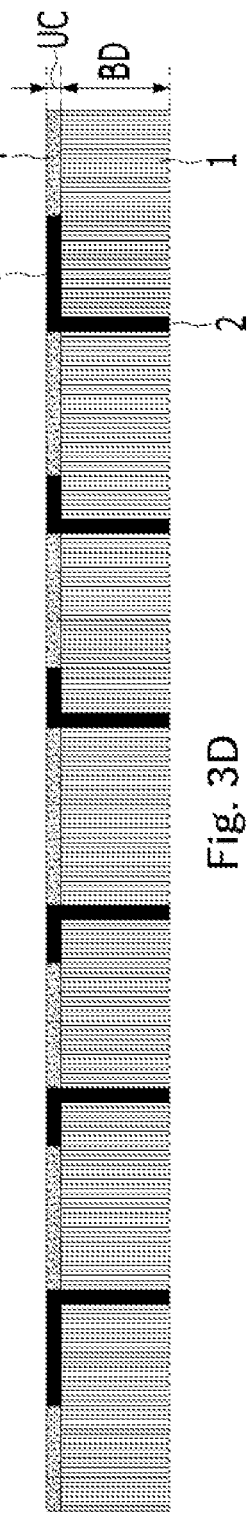

As illustrated in FIG. 3A, an anodic oxide film 1 having through-holes 1b may be provided. Then, as illustrated in FIG. 3B, a junction layer 4 may be provided. Then, as illustrated in FIG. 3C, a process of patterning the junction layer 4 may be performed. By this patterning, patterned areas PF may be formed on an upper surface of the anodic oxide film 1. Then, as illustrated in FIG. 3D, a process of simultaneously charging a metal material into the patterned areas PF and the through-holes 1b may be performed. Therefore, vertical wiring parts 2 and horizontal wiring parts 3 may be formed simultaneously.

When the vertical wiring parts 2 and the horizontal wiring parts 3 are formed simultaneously in this manner, since the process of filling the metal material may be performed at once, it may be possible to manufacture the unit anodic oxide film wiring substrate 10 relatively efficiently.

In the present invention, as described with reference to FIGS. 2A to 2E, the unit anodic oxide film wiring substrate 10 may be manufactured by including a process of forming the vertical wiring parts 2 and then forming the horizontal wiring parts 3. Alternatively, as described with reference to FIGS. 3A to 3D, the unit anodic oxide film wiring substrate 10 may be manufactured by including a process of simultaneously forming the vertical wiring parts 2 and the horizontal wiring parts 3. In other words, in the present invention, the unit anodic oxide film wiring substrate 10 may be manufactured by including a process of simultaneously forming the vertical wiring parts 2 and the horizontal wiring parts 3, or individually forming the vertical wiring parts 2 and the horizontal wiring parts 3 and connecting the same to each other. The unit anodic oxide film wiring substrate 10 manufactured by such a manufacturing method may constitute the multilayer wiring substrate 100 to form a structure having excellent joining strength.

Figure 4:
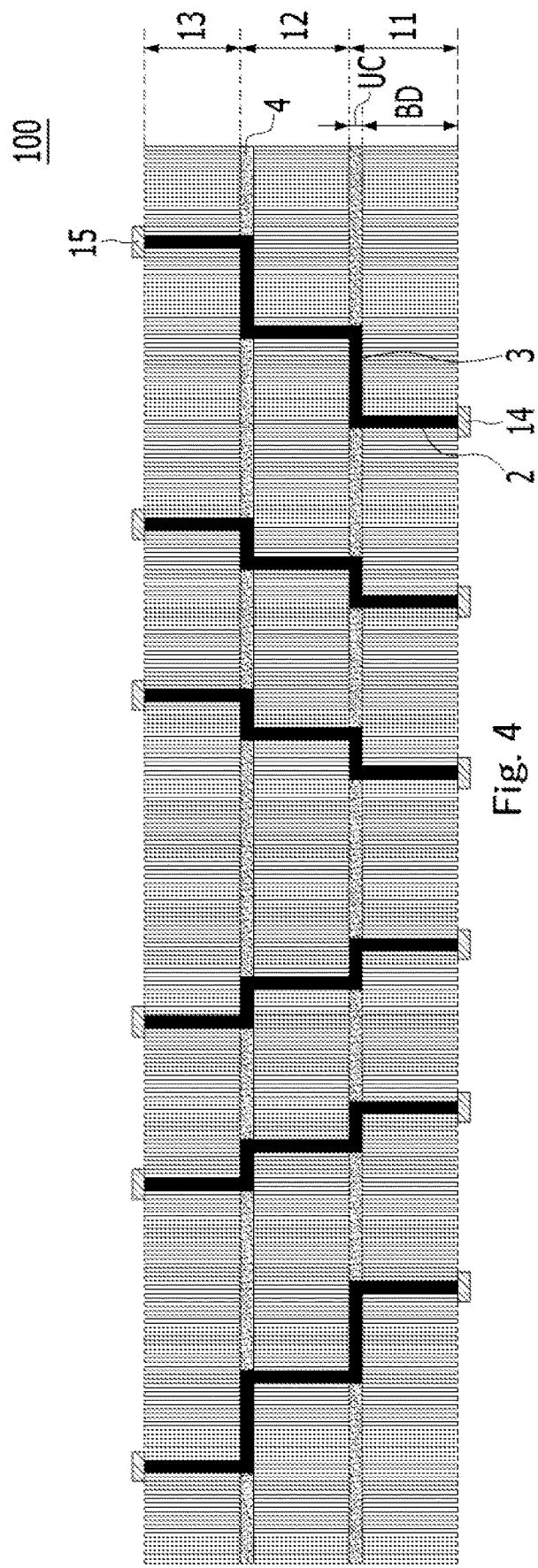
FIG. 4 is a view schematically illustrating the multilayer wiring substrate according to the first embodiment of the present invention.

FIG. 4 is a view schematically illustrating the multilayer wiring substrate 100 according to the first embodiment of the present invention.

As illustrated in FIG. 4, the multilayer wiring substrate 100 according to the present invention may be configured by joining the plurality of unit anodic oxide film wiring substrates 10 to each other from top to bottom by the junction layer 4, each of the unit anodic oxide film wiring substrates 10 including the vertical wiring part 2 passing through the anodic oxide film 1 from top to bottom and the horizontal wiring part 3 provided on the upper surface of the anodic oxide film 1 so as to be connected to the vertical wiring part 2, wherein each of the unit anodic oxide film wiring substrates 10 may include: a body part BD including the anodic oxide film 1 having the through-hole 1b and the vertical wiring part 2 provided in the through-hole 1b; and the upper layer part UC provided on the upper portion of the body part BD and including the horizontal wiring part 3 provided to be connected to the vertical wiring part 2 and the junction layer 4 provided around the horizontal wiring part 3.

As illustrated in FIG. 4, in the multilayer wiring substrate 100 according to the first embodiment may have a configuration in which the plurality of unit anodic oxide film wiring substrates 10 are stacked and joined to each other by the junction layer 4 included in the upper layer part UC.

Since the multilayer wiring substrate 100 is provided to compensate for a difference in pitch between a printed circuit board (PCB) substrate and probes 17, the plurality of unit anodic oxide film wiring substrates 10 constituting the multilayer wiring substrate 100 may be configured such that the vertical wiring parts 2 thereof are arranged in different pitches.

As illustrated in FIG. 4, in the present invention, as an example, the multilayer wiring substrate 100 may be composed of a first unit anodic oxide film wiring substrate 11 including a first connection pad 14 to which each probe 17 is attached, a second unit anodic oxide film wiring substrate 12 provided on an upper portion of the first unit anodic oxide film wiring substrate 11, and a third unit anodic oxide film wiring substrate 13 including a second connection pad 15 electrically connected to each terminal of the PCB substrate. In the present invention, although it is described as an example that the multilayer wiring substrate 100 is composed of the first to third unit anodic oxide film wiring substrates 11, 12, and 13, the number of the unit anodic oxide film wiring substrates 10 constituting the multilayer wiring substrate 100 is not limited thereto.

Since the first unit anodic oxide film wiring substrate 11 includes respective first connection pads 14 to which the probes 17 are attached, the first unit anodic oxide film wiring substrate 11 may be configured such that the vertical wiring parts 2 thereof have the same pitch as the probes 17.

The second unit anodic oxide film wiring substrate 12 provided on the upper portion of the first unit anodic oxide film wiring substrate 11 may be configured such that the vertical wiring parts 2 thereof have a wider pitch than the vertical wiring parts 2 of the first unit anodic oxide film wiring substrate 11. In this case, a difference in pitch between the vertical wiring parts 2 of the first unit anodic oxide film wiring substrate 11 and the vertical wiring parts 2 of the second unit anodic oxide film wiring substrate 12 may be compensated by the horizontal wiring parts 3 interposed between the first and second unit anodic oxide film wiring substrates 11 and 12. The horizontal wiring parts 3 that compensate for the difference in pitch between the vertical wiring parts 2 of the first and second unit anodic oxide film wiring substrates 11 and 12 may be the horizontal wiring parts 3 constituting the upper layer part UC of the first unit anodic oxide film wiring substrate 11.

The third unit anodic oxide film wiring substrate 13 provided on an upper portion of the second unit anodic oxide film wiring substrate 12 may be configured such that the vertical wiring parts 2 thereof have a wider pitch than the vertical wiring parts 2 of the second unit anodic oxide film wiring substrate 12. In this case, a difference in pitch between the vertical wiring parts 2 of the second and third unit anodic oxide film wiring substrates 12 and 13 may be compensated by the horizontal wiring parts 3 of the second unit anodic oxide film wiring substrate 12. The horizontal wiring parts 3 that compensate for the difference in pitch between the vertical wiring parts 2 of the second and third unit anodic oxide film wiring substrates 12 and 13 may be the horizontal wiring parts 3 constituting the upper layer part UC of the second unit anodic oxide film wiring substrate 12.

As such, the horizontal wiring parts 3 may compensate for the difference in pitch between the vertical wiring parts 2 in each of the first, second, and third unit anodic oxide film wiring substrates 11, 12, and 13 thereby electrically connecting the first, second, and third unit anodic oxide film wiring substrates 11, 12, and 13 to each other.

In the present invention, the junction layer 4 may be provided around the horizontal wiring parts 3. This may form a structure in which the respective junction layers 4 join the respective anodic oxide film wiring substrates 10 to each other around the horizontal wiring parts 3.

As illustrated in FIG. 4, in the present invention, the horizontal wiring parts 3 and the junction layer 4 may be provided on the same layer so that the upper layer part UC may be formed on the body part BD.

As illustrated in FIG. 4, the multilayer wiring substrate 100 according to the present invention may have a structure in which the unit anodic oxide film wiring substrate 10 is stacked on an upper surface of the upper layer part UC. This may make it possible to easily form a structure in which there exists no gap between the unit anodic oxide film wiring substrates 11, 12, and 13 by joining between the respective unit anodic oxide film wiring substrates 11, 12, and 13.

In the present invention, by configuring the unit anodic oxide film wiring substrate 10 with the anodic oxide film 1 having the pores 1a formed therein, each of the horizontal wiring parts 3 provided in the upper layer part UC, which is a layer in which the junction layer 4 is provided, may at least partially penetrate into the pores 1a. This may increase a junction area with the result that the joining strength of the multilayer wiring substrate 100 may be further increased.

Referring to FIG. 4, as an example, the horizontal wiring parts 3 of the first unit anodic oxide film wiring substrate 11 may penetrate into the pores 1a of the anodic oxide film 1 of the second unit anodic oxide film wiring substrate 12 at positions corresponding to the horizontal wiring parts 3. In addition, the horizontal wiring parts 3 of the second unit anodic oxide film wiring substrate 12 may penetrate into the pores 1a of the anodic oxide film 1 of the third unit anodic oxide film wiring substrate 13 at positions corresponding to the horizontal wiring parts 3. This may provide an anchoring effect for joining the unit anodic oxide film wiring substrates 10 to each other and prevent a peeling phenomenon therebetween.

As such, in the present invention, even in an area in which the junction layer 4 is not provided, the joining between the unit anodic oxide film wiring substrates 10 may be made by the metal material forming the horizontal wiring part 3. As a result, the plurality of unit anodic oxide film wiring substrates 10 constituting the multilayer wiring substrate 100 may be joined to each other without gaps, thereby having excellent joining strength.

FIGS. 5A, 5B, 5C, 5D, and 5E and FIGS. 6A, 6B, and 6C are views schematically illustrating a method of manufacturing a unit anodic oxide film wiring substrate 10' constituting a multilayer wiring substrate 100' according to a second embodiment of the present invention.

The unit anodic oxide film wiring substrate 10' constituting the multilayer wiring substrate 100' according to the second embodiment differs from the first embodiment in that a junction layer 4 provided to join a plurality of unit anodic oxide film wiring substrates 10' to each other is composed of first and second junction layers 5 and 6 that are provided on upper and lower surfaces of a body part BD. In the second embodiment which will be described below, a characteristic configuration different from the first embodiment will be mainly described, and a description of the same configuration as the first embodiment will be omitted.

The multilayer wiring substrate 100' according to the second embodiment may be manufactured by a method including: manufacturing the unit anodic oxide film wiring substrate 10' in such a manner that the first junction layer 5 is provided on a lower portion of the anodic oxide film 1, the first junction layer 5 is subjected to patterning, a through-hole 1b is formed by etching at least a part of the anodic oxide film 1, a vertical wiring part 2 is formed by charging a metal material into the through-hole 1b, the second junction layer 6 is provided on an upper portion of the anodic oxide film 1, the second junction layer 6 is subjected to patterning, and a horizontal wiring part 3 is formed on an upper surface of the patterned anodic oxide film 1 so as to be connected to the vertical wiring part 2; providing a plurality of unit anodic oxide film wiring substrates 10' and stacking the unit anodic oxide film wiring substrates 10' from top to bottom; and joining the stacked unit anodic oxide film wiring substrates 10' to each other by the first and second junction layers 5 and 6.

Figure 5A:

First, as illustrated in FIG. 5A, the anodic oxide film 1 including pores 1a may be provided.

Figure 5B:
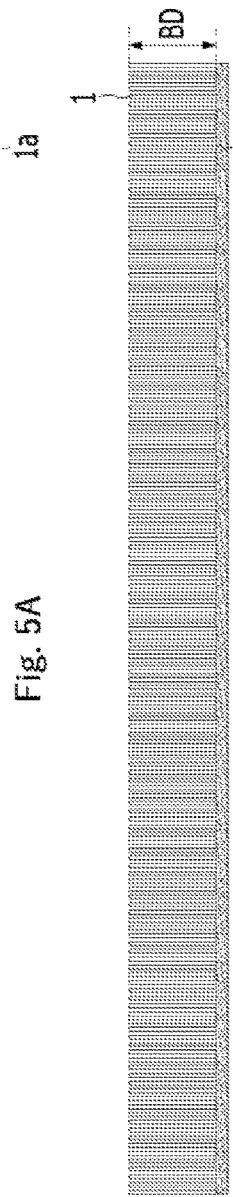
Figure 5C:
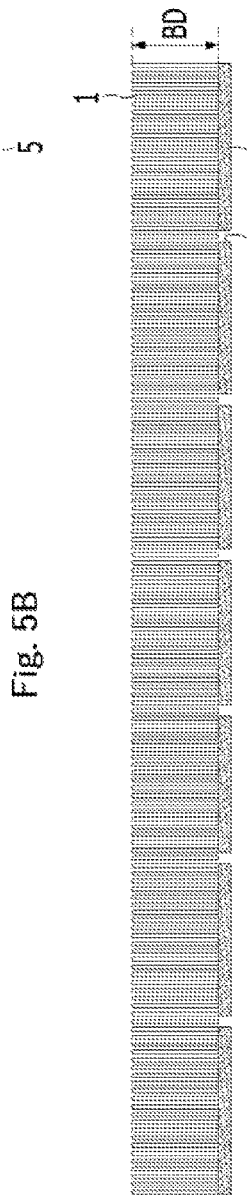

Then, as illustrated in FIG. 5B, the first junction layer 5 may be provided on the lower portion of the anodic oxide film 1. Then, as illustrated in FIG. 5C, a process of patterning the first junction layer 5 may be performed. By patterning the first junction layer 5, a first patterned area PF1 may be formed on the lower portion of the anodic oxide film 1.

Figure 5D:
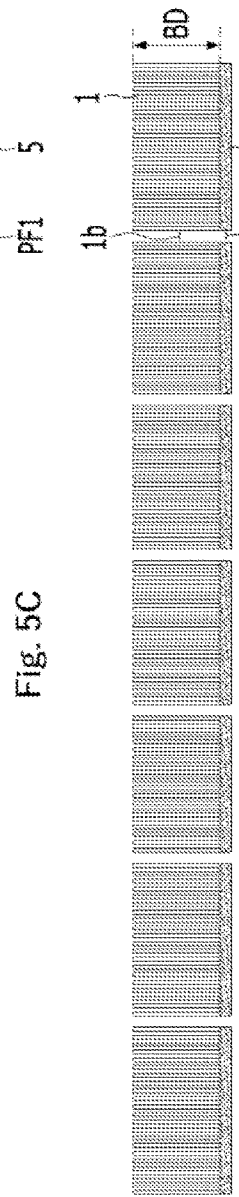

Then, as illustrated in FIG. 5D, the through-hole 1b may be formed by performing etching through the first patterned area PF1. Since the through-hole 1b is formed by performing etching through the first patterned area PF1, the through-hole 1b may be formed to have the same diameter as the first patterned area PF1. Therefore, a structure in which the through-hole 1b and the first patterned area PF1 communicate with each other in a straight shape may be formed.

In the unit anodic oxide film wiring substrate 10', the first junction layer 5 may function as a mask for forming the vertical wiring part 2 provided in the through-hole 1b. In addition, the first junction layer 5 may not be removed from the lower portion of the anodic oxide film 1 but remain to be used to perform a joining function for joining the plurality of unit anodic oxide film wiring substrates 10'. In other words, the first junction layer 5 may simultaneously perform a function as a mask for forming the vertical wiring part 2 and the joining function.

Figure 5E:
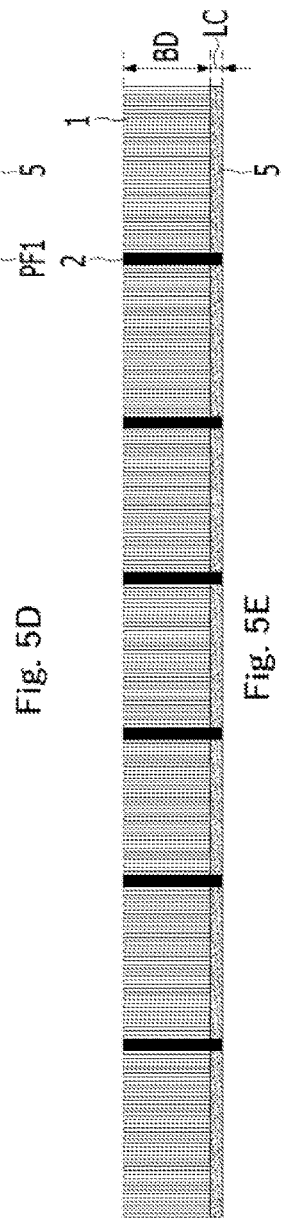

Then, as illustrated in FIG. 5E, the vertical wiring part 2 may be formed by charging a metal material into the through-hole 1b and the first patterned area PF. In the unit anodic oxide film wiring substrate 10', by the process of FIGS. 5C to 5E, a lower layer part LC composed of the vertical wiring part 2 and the first junction layer 5 provided around the vertical wiring part 2 may be formed.

In the manufacturing the unit anodic oxide film wiring substrate 10', as illustrated in FIG. 5E, after the lower layer part LC is formed on the lower portion of the anodic oxide film 1, as illustrated in FIGS. 6A to 6C, a process of forming an upper layer part UC, which is composed of the horizontal wiring part 3 and the second junction layer 6 provided around the horizontal wiring part 3, on the upper portion of the anodic oxide film 1 may be performed.

Specifically, as illustrated in FIG. 6A, the second junction layer 6 may be provided on the upper portion of the anodic oxide film 1. Then, as illustrated in FIG. 6B, a process of forming a second patterned area PF2 including a vertical projection area of the vertical wiring part 2 may be performed. Then, as illustrated in FIG. 6C, a process of charging a metal material for forming the horizontal wiring part 3 into the second patterned area PF2 may be performed. Through this process, the horizontal wiring part 3 may be provided in the second patterned area PF2.

In the unit anodic oxide film wiring substrate 10', the second junction layer 6 may function to provide a space for forming the horizontal wiring part 3 as described above. In addition, the second junction layer 6 may not be removed from the upper portion of the anodic oxide film 1 but remain to be used to perform a joining function for joining the unit anodic oxide film wiring substrates 10'. In other words, the second junction layer 6 may simultaneously perform a function of providing the space for forming the horizontal wiring part 3 and the joining function.

The unit anodic oxide film wiring substrate 10' constituting the multilayer wiring substrate 100' according to second embodiment may be manufactured by other methods. FIGS. 7A, 7B, 7C, and 7D and FIGS. 8A, 8B, and 8C are views schematically illustrating another embodiment of the method of manufacturing the unit anodic oxide film wiring substrate 10'.

As illustrated in FIG. 7A, an anodic oxide film 1 including pores 1a may be provided. Then, as illustrated in FIG. 7B, a first junction layer 5 may be provided on a lower portion of the anodic oxide film 1. Then, as illustrated in FIG. 7C, a process of patterning the first junction layer 5 to form a first patterned area PF1 may be performed. Then, as illustrated in FIG. 7D, a process of forming a through-hole 1b in the anodic oxide film 1 through the first patterned area PF1 may be performed.

Figure 8A:
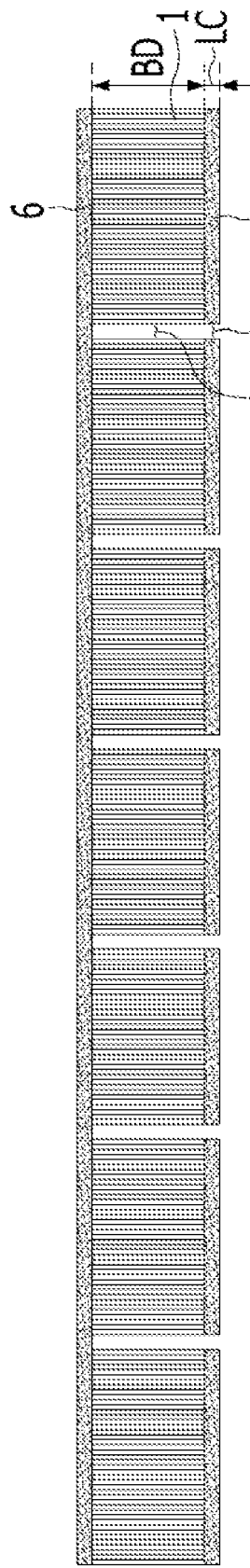
Figure 8B:
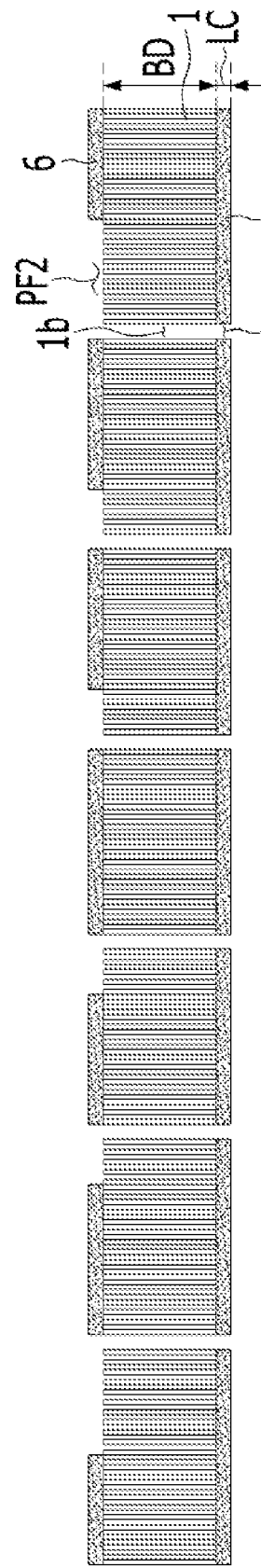
Figure 8C:
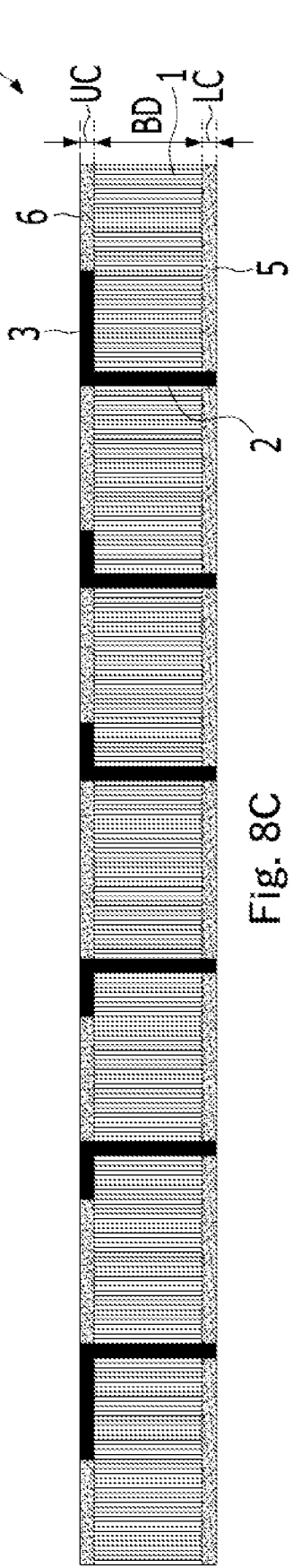

Then, as illustrated in FIG. 8A, a process of providing a second junction layer 6 may be performed. Then, as illustrated in FIG. 8B, a process of patterning the second junction layer 6 to form forming a second patterned area PF2 may be performed. In this case, the second patterned area PF2 may be formed to include the through-hole 1b and a vertical projection area of the first patterned area PF1. Therefore, a structure in which the first and second patterned areas PF1 and PF2 and the through-hole 1b communicate with each other may be formed. With such a structure, as illustrated in FIG. 8C, a process of simultaneously charging a metal material into the first and second patterned areas PF1 and PF2 and the through-hole 1b may be more easily performed. When the vertical wiring part 2 and the horizontal wiring part 3 are formed simultaneously in this manner, a process of manufacturing the unit anodic oxide film wiring substrate 10' may be performed relatively efficiently.

As described above, the unit anodic oxide film wiring substrate 10' constituting the second embodiment may be manufactured by including a process of simultaneously forming the vertical wiring part 2 and the horizontal wiring part 3, or individually forming the vertical wiring part 2 and the horizontal wiring part 3 and connecting the same to each other.

In the present invention, although it is described as an example that the first junction layer 5 is first provided on the lower portion of the anodic oxide film 1 and then the second junction layer 6 is provided on the upper portion thereof, the order of providing the first and second junction layers 5 and 6 is not limited thereto. However, when the first junction layer 5 is first provided on the lower portion of the anodic oxide film 1 and then the second junction layer 6 is provided on the upper portion thereof, since a structure in which the first and second patterned areas PF1 and PF2 and the through-hole 1b communicate with each other may be formed, it is preferable that a manufacturing method including a process of simultaneously forming the vertical wiring part 2 and the horizontal wiring part 3 by simultaneously charging the metal material thereinto is used.

As described with reference to FIGS. 5A to 8C, the unit anodic oxide film wiring substrate 10' constituting the second embodiment may include the first junction layer 5 and the second junction layer 6 on the upper and lower portions of the anodic oxide film 1, respectively. This may increase an area joined by the junction layers (specifically, the first and second junction layers 5 and 6) in a stacked structure of the multilayer wiring substrate 100', which may make it possible to manufacture the multilayer wiring substrate 100' having excellent joining strength.

Figure 9A:
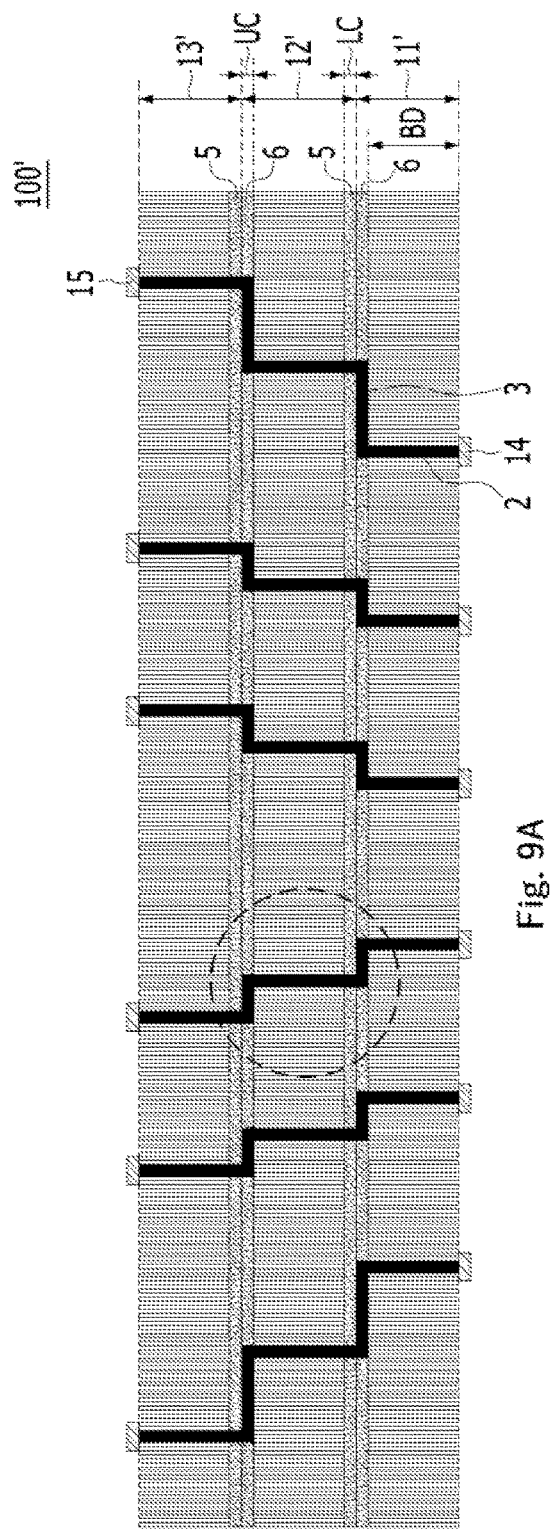
FIGS. 9A and 9B are views schematically illustrating the multilayer wiring substrate according to the second embodiment of the present invention.
Figure 9B:
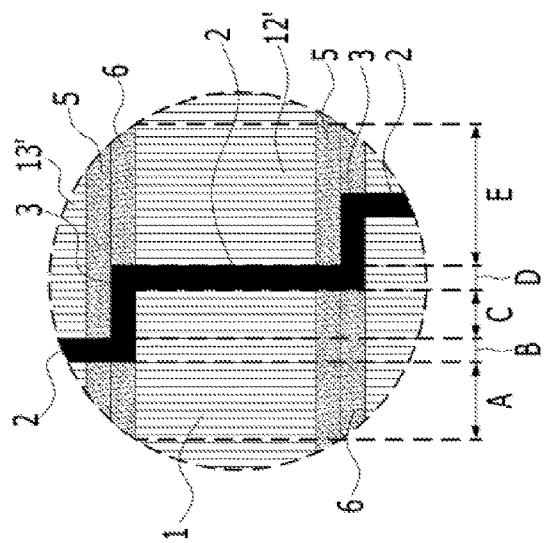

This will be described in detail with reference to FIGS. 9A and 9B. FIG. 9A is a view schematically illustrating the multilayer wiring substrate 100' according to the second embodiment, and FIG. 9B is a view illustrating an enlarged portion of the multilayer wiring substrate 100'.

As illustrated in FIG. 9A, the multilayer wiring substrate 100' may be configured by joining the plurality of unit anodic oxide film wiring substrates 10' to each other from top to bottom by the first and second junction layers 5 and 6, each of the unit anodic oxide film wiring substrates 10' including the vertical wiring part 2 passing through the anodic oxide film 1 from top to bottom and the horizontal wiring part 3 provided on the upper surface of the anodic oxide film 1 so as to be connected to the vertical wiring part 2, wherein each of the unit anodic oxide film wiring substrates 10' may include: the body part BD including the anodic oxide film 1 having the through-hole 1b and the vertical wiring part 2 provided in the through-hole 1b; the lower layer part LC provided on a lower portion of the body part BD and including the vertical wiring part 2 and the first junction layer 5 provided around the vertical wiring part 2; and the upper layer part UC provided on an upper portion of the body part BD and including the horizontal wiring part 3 provided to be connected to the vertical wiring part 2 and the second junction layer 6 provided around the horizontal wiring part 3.

In the multilayer wiring substrate 100' according to the second embodiment including the unit anodic oxide film wiring substrate 10' having such a structure, since the first and second junction layers 5 and 6 may be provided on the upper and lower portions of the anodic oxide film 1 of the unit anodic oxide film wiring substrate 10', this may be more advantageous in terms of increasing the joining strength of the multilayer wiring substrate 100'. This may be because the area joined by the first and second junction layers 5 and 6 is larger than a junction area between metals (specifically, the vertical wiring part 2 and the horizontal wiring part 3).

As an example, the multilayer wiring substrate 100' illustrated in FIG. 9A may be composed of first to third unit anodic oxide film wiring substrates 11', 12', and 13'.

In this case, FIG. 9B may be an enlarged view of at least a portion of the stacked second and third unit anodic oxide film wiring substrates 12' and 13'.

As illustrated in FIG. 9B, 'section A' may be a section in which a second junction layer 6 of the second unit anodic oxide film wiring substrate 12' and a first junction layer 5 of the third unit anodic oxide film wiring substrate 13' are joined to each other. 'Section B' may be a section in which at least a part of a horizontal wiring part 3 of the second unit anodic oxide film wiring substrate 12' and a vertical wiring part 2 of the third unit anodic oxide film wiring substrate 13' are joined to each other. In addition, 'section C' may be a section in which the horizontal wiring part 3 of the second unit anodic oxide film wiring substrate 12' and at least a part of a first junction layer 5 of the third unit anodic oxide film wiring substrate 13' are joined to each other. 'Section D' may be a section in which at least a part of the horizontal wiring part 3 of the second unit anodic oxide film wiring substrate 12' and at least a part of the first junction layer 5 of the third unit anodic oxide film wiring substrate 13' are joined to each other. 'Section E' may be a section in which a second junction layer 6 of the second unit anodic oxide film wiring substrate 12' and the first junction layer 5 of the third unit anodic oxide film wiring substrate 13' are joined to each other.

When the first and second junction layers 5 and 6 are provided on the upper and lower portions of the anodic oxide film 1, as an example, as illustrated in the section A to the section E, an area joined by the junction layers (specifically, the first and second junction layers 5 and 6) may be larger than a junction area between metals.

In other words, in the multilayer wiring substrate 100' according to the present invention, due to the first and second junction layers 5 and 6 provided on the upper and lower portions of the anodic oxide film 1, a remaining area except for an area where the vertical wiring part 2 and the horizontal wiring part 3 are connected to each other by metal joining may be composed of an area joined by at least one of the first junction layer 5 and the second junction layer 6.

As such, the remaining area except for the junction area between metals (the vertical wiring part 2 and the horizontal wiring part 3) may be composed of an area where the junction layer (specifically, at least one of the first and second junction layers 5 and 6) and metal are joined to each other, and an area where the junction layers (specifically, the first and second junction layers 5 and 6) are joined to each other. Therefore, it may be possible for the multilayer wiring substrate 100' to have excellent joining strength.

In addition, due to the vertical wiring part 2 and the first junction layer 5 around the vertical wiring part 2, which are provided on the same plane, and due to the horizontal wiring part 3 and the second junction layer 6 around the horizontal wiring part 3, which are provided on the same plane, a structure that enables joining without gaps may be formed, which may obtain an effect of having durability in terms of structure.

Figure 10:
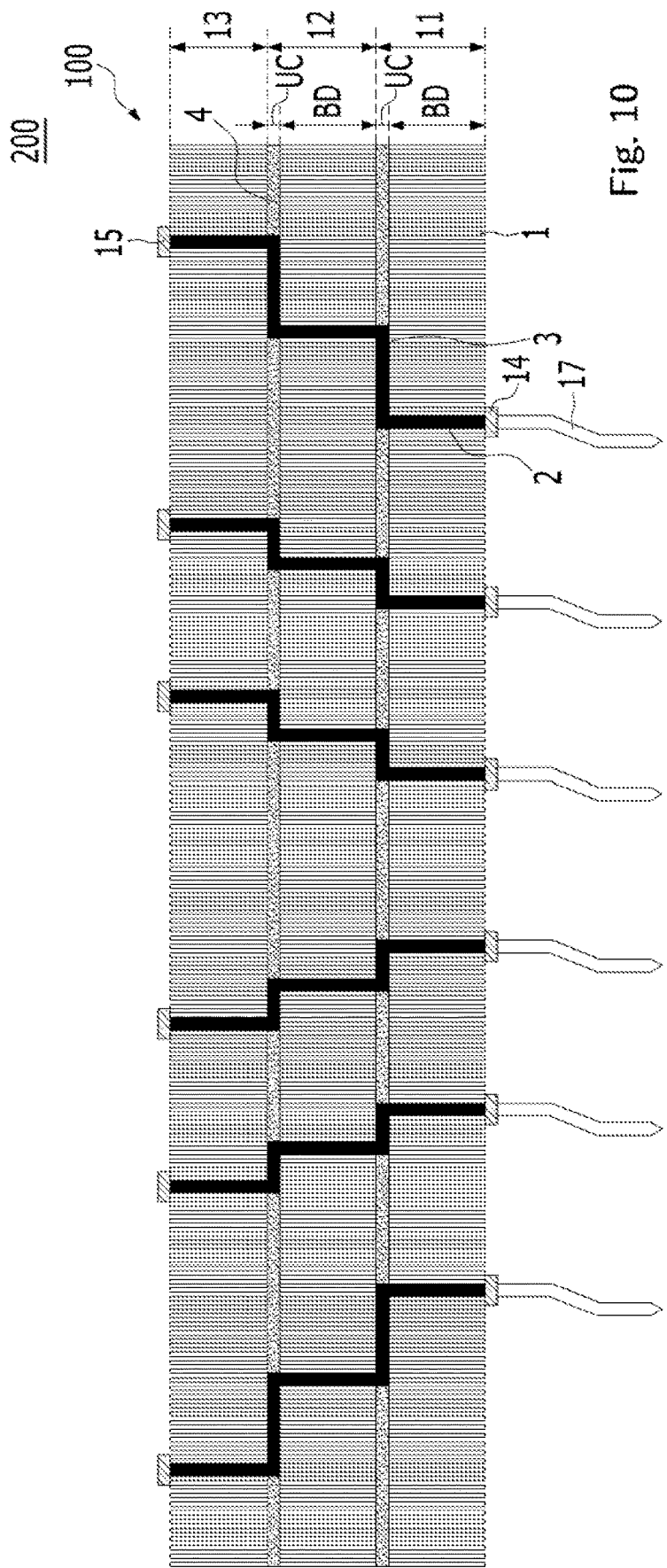
FIG. 10 is a view illustrating a probe card having the multilayer wiring substrate according to the first embodiment.

FIG. 10 is a view illustrating the probe card 200 having the multilayer wiring substrate 100 according to the first embodiment. In this case, in FIG. 10, as an example, although it is described that the multilayer wiring substrate 100 according to the first embodiment is provided on the probe card 200, the multilayer wiring substrate 100' according to the second embodiment may be provided on the probe card 200 to constitute the probe card 200 having excellent joining strength.

Depending on the structure of installing the probes 17 on the multilayer wiring substrate 100 and the structure of the probe 200, the probe card 200 may be divided into a vertical type probe card, a cantilever type probe card, a MEMS probe card 200. In the present invention, as an example, it will be described that the multilayer wiring substrate 100 is provided on the MEMS probe card 200. The type of probe card on which the multilayer wiring substrate 100 is provided is not limited thereto, and may be provided on the above-described vertical type probe card or cantilever type probe card.

As illustrated in FIG. 10, the probe card 200 may have the multilayer wiring substrate 100 that is configured by joining the plurality of unit anodic oxide film wiring substrates 10 to each other from top to bottom by the junction layer 4, each of the unit anodic oxide film wiring substrates 10 including the vertical wiring part 2 passing through the anodic oxide film 1 from top to bottom and the horizontal wiring part 3 provided on the upper surface of the anodic oxide film 1 so as to be connected to the vertical wiring part 2, wherein the probe card 200 may include: the unit anodic oxide film wiring substrates 10 each including the body part BD including the anodic oxide film 1 having the through-hole 1b and the vertical wiring part 2 provided in the through-hole 1b, and the upper layer part UC provided on the upper portion of the body part BD and including the horizontal wiring part 3 provided to be connected to the vertical wiring part 2 and the junction layer 4 provided around the horizontal wiring part 3; the first connection pad 14 provided on a lower portion of the joined unit anodic oxide film wiring substrates 10; the second connection pad 15 provided on an upper portion of the joined unit anodic oxide film wiring substrates 10 and electrically connected to the terminal of the PCB substrate; and the probe 17 electrically connected to the first connection pad 14.

As illustrated in FIG. 10, as an example, the probe card 200 may include the multilayer wiring substrate 100 having a structure in which the first unit anodic oxide film wiring substrate 11, the second unit anodic oxide film wiring substrate 12, and the third unit anodic oxide film wiring substrate 13 are sequentially stacked.

The multilayer wiring substrate 100 may have a structure in which the junction layer 4 is provided on a side of each of the unit anodic oxide film wiring substrates 11, 12, and 13 at a position interposed therebetween, so that the first to third unit anodic oxide film wiring substrates 11, 12, and 13 may be joined to each other by the respective junction layers 4. In this case, the junction layer 4 may be provided around the horizontal wiring parts 3 for compensating for the difference in pitch between the vertical wiring parts 2 of the first to third anodic oxide film wiring substrates 11, 12, and 13. With such a structure, the first to third anodic oxide film wiring substrates 11, 12, and 13 may be joined to each other without gaps.

The first connection pad 14 to which the probe 17 is attached may be provided on a lower portion the vertical wiring part 2 of the first unit anodic oxide film wiring substrate 11.

In addition, the second connection pad 15 electrically connected to the terminal of the PCB substrate may be provided on the upper portion of the third unit anodic oxide film wiring substrate 13.

As illustrated in FIG. 10, the multilayer wiring substrate 100 according to the present invention may have a structure in which the plurality of unit anodic oxide film wiring substrates 10 joined to each other without gaps by the junction layers 4 are stacked. Therefore, the probe card 200 having the multilayer wiring substrate 100 may have excellent joining strength in terms of structure. In addition, since the multilayer wiring substrate 100 according to the present invention may be formed in a structure in which joining is performed by the junction layer 4, which may be suitable to provide a low-resistance metal material as a wiring part. This may increase transmission speed of an electric signal during a test process using the probe card 200 having the multilayer wiring substrate 100 according to the present invention. As a result, it may be possible to obtain an effect of increasing reliability of the probe card 200.

Although the exemplary embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method of manufacturing a multilayer wiring substrate, the method comprising:
   manufacturing a unit anodic oxide film wiring substrate in such a manner that through-holes are formed by etching at least a part of an anodic oxide film, vertical wiring parts are formed by charging a metal material into the through-holes, a junction layer is formed on at least a side of the anodic oxide film, the junction layer is subjected to patterning, and horizontal wiring parts are formed on an upper surface of the patterned anodic oxide film so as to be connected to the vertical wiring parts each other, wherein the junction layer is provided around the horizontal wiring parts without a gap on the same plane in a single layer provided on the anodic oxide film;
   providing a plurality of unit anodic oxide film wiring substrates, the plurality of unit anodic oxide film wiring substrates including a first unit anodic oxide film wiring substrate, a second unit anodic oxide film wiring substrate, and a third unit anodic oxide film wiring substrate, and stacking the first, second, and third unit anodic oxide film wiring substrates from top to bottom; and
   joining the first, second, and third unit anodic oxide film wiring substrates stacked from top to bottom to each other by the junction layer,
   wherein the second unit anodic oxide film wiring substrate is provided on an upper portion of the first unit anodic oxide film wiring substrate, and the third unit anodic oxide film wiring substrate is provided on an upper portion of the second unit anodic oxide film wiring substrate, and
   wherein second vertical wiring parts of the second unit anodic oxide film wiring substrate have a wider pitch than first vertical wiring parts of the first unit anodic oxide film wiring substrate, and third vertical wiring parts of the third unit anodic oxide film wiring substrate have a wider pitch than the second vertical wiring parts of the second unit anodic oxide film wiring substrate.

2. The method of claim 1, wherein the junction layer is a photosensitive material.

3. The method of claim 1, wherein the metal material is a low-resistance metal material including one or more of Au, Ag, and Cu.

4. The method of claim 3, wherein the vertical wiring part and the horizontal wiring part are made of the same metal material.

5. The method of claim 1, wherein the vertical wiring part and the horizontal wiring part are simultaneously formed or are individually formed and connected to each other.

6. The method of claim 1, wherein first horizontal wiring parts of the first unit anodic oxide film wiring substrate are connected to the second vertical wiring parts of the second unit anodic oxide film wiring substrate, and second horizontal wiring parts of the second unit anodic oxide film wiring substrate are connected to the third vertical wiring parts of the third unit anodic oxide film wiring substrate.

7. A multilayer wiring substrate configured by joining unit anodic oxide film wiring substrates to each other from top to bottom by a junction layer, each of the unit anodic oxide film wiring substrates including vertical wiring parts passing through an anodic oxide film from top to bottom and horizontal wiring parts provided on an upper surface of the anodic oxide film so as to be connected to the vertical wiring parts each other,
   wherein each of the unit anodic oxide film wiring substrates comprises:
   a body part including the anodic oxide film having through-holes and the vertical wiring parts provided in the through-holes; and
   an upper layer part provided on an upper portion of the body part and including the horizontal wiring parts provided to be connected to the vertical wiring parts and the junction layer provided around the horizontal wiring parts,
   wherein the junction layer is provided around the horizontal wiring parts without a gap on the same plane in a single layer provided on the anodic oxide film,
   wherein the unit anodic oxide film wiring substrates include a first unit anodic oxide film wiring substrate, a second unit anodic oxide film wiring substrate, and a third unit anodic oxide film wiring substrate,
   wherein the first, second, and third unit anodic oxide film wiring substrates are stacked and joined from top to bottom to each other by the junction layer,
   wherein the second unit anodic oxide film wiring substrate is provided on an upper portion of the first unit anodic oxide film wiring substrate, and the third unit anodic oxide film wiring substrate is provided on an upper portion of the second unit anodic oxide film wiring substrate, and
   wherein second vertical wiring parts of the second unit anodic oxide film wiring substrate have a wider pitch than first vertical wiring parts of the first unit anodic oxide film wiring substrate, and third vertical wiring parts of the third unit anodic oxide film wiring substrate have a wider pitch than the second vertical wiring parts of the second unit anodic oxide film wiring substrate.

8. A probe card having a multilayer wiring substrate configured by joining unit anodic oxide film wiring substrates to each other from top to bottom by a junction layer, each of the unit anodic oxide film wiring substrates including vertical wiring parts passing through an anodic oxide film from top to bottom and horizontal wiring parts provided on an upper surface of the anodic oxide film so as to be connected to the vertical wiring parts each other, the probe card comprising:
   the unit anodic oxide film wiring substrates each including a body part including the anodic oxide film having through-holes and the vertical wiring parts provided in the through-holes, and an upper layer part provided on an upper portion of the body part and including the horizontal wiring parts provided to be connected to the vertical wiring parts and the junction layer provided around the horizontal wiring parts;
   a first connection pad provided on a lower portion of the joined unit anodic oxide film wiring substrates;
   a second connection pad provided on an upper portion of the joined unit anodic oxide film wiring substrates and electrically connected to a terminal of a printed circuit board (PCB) substrate; and
   a probe electrically connected to the first connection pad,
   wherein the junction layer is provided around the horizontal wiring parts without a gap on the same plane in a single layer provided on the anodic oxide film,
   wherein the unit anodic oxide film wiring substrates include a first unit anodic oxide film wiring substrate, a second unit anodic oxide film wiring substrate, and a third unit anodic oxide film wiring substrate, wherein the first, second, and third unit anodic oxide film wiring substrates are stacked and joined from top to bottom to each other by the junction layer, wherein the second unit anodic oxide film wiring substrate is provided on an upper portion of the first unit anodic oxide film wiring substrate, and the third unit anodic oxide film wiring substrate is provided on an upper portion of the second unit anodic oxide film wiring substrate, wherein second vertical wiring parts of the second unit anodic oxide film wiring substrate have a wider pitch than first vertical wiring parts of the first unit anodic oxide film wiring substrate, and third vertical wiring parts of the third unit anodic oxide film wiring substrate have a wider pitch than the second vertical wiring parts of the second unit anodic oxide film wiring substrate.

\* \* \* \* \*